United States Patent [19]

Eguchi

[11] Patent Number: 4,881,272
[45] Date of Patent: Nov. 14, 1989

[54] MULTI-BAND FM RECEIVER FOR RECEIVING FM BROADCASTING SIGNALS AND TV BROADCASTING SOUND SIGNALS

[75] Inventor: Toyokazu Eguchi, Yokohama, Japan
[73] Assignee: Kabushiki Kaisha Toshiba, Kanagawa, Japan
[21] Appl. No.: 175,031
[22] Filed: Mar. 29, 1988

[30] Foreign Application Priority Data

Mar. 30, 1987 [JP] Japan .................................. 62-76638

[51] Int. Cl.⁴ ........................................... H04B 11/16
[52] U.S. Cl. .................................... 455/143; 455/180; 455/188
[58] Field of Search ............... 455/205, 143, 188, 200, 455/209, 182, 183, 180, 142, 216, 260, 176, 264; 338/189

[56] References Cited

U.S. PATENT DOCUMENTS

| | | | |
|---|---|---|---|
| 4,181,890 | 1/1980 | Yamamoto | 455/143 |
| 4,518,993 | 5/1985 | Okada et al. | 455/176 |
| 4,577,171 | 3/1986 | Heigl et al. | 455/188 |
| 4,688,264 | 8/1987 | Miura | 455/188 |

*Primary Examiner*—Robert L. Griffin
*Assistant Examiner*—Curtis Kuntz
*Attorney, Agent, or Firm*—Finnegan, Henderson, Farabow, Garrett and Dunner

[57] ABSTRACT

A multi-band receiver for receiving broadcast signals divided by frequencies into an FM group and a TV group, the TV group including at least two different frequency ranges separated by a substantial frequency gap. The receiver includes a band selector for selecting a desired frequency group from the two group, a tuning controller for selecting a desired broadcast frequency within the desired group from a predetermined tuning band, an oscillator for separating signals of the desired frequency from the received broadcast signals and converting the separated signals into audio signals and a frequency adjuster responsive to the band selector and the tuning controller for automatically adjusting the oscillation frequency of the oscillator when the TV group has been selected for substantially removing the frequency gap from the predetermined tuning band.

6 Claims, 1 Drawing Sheet

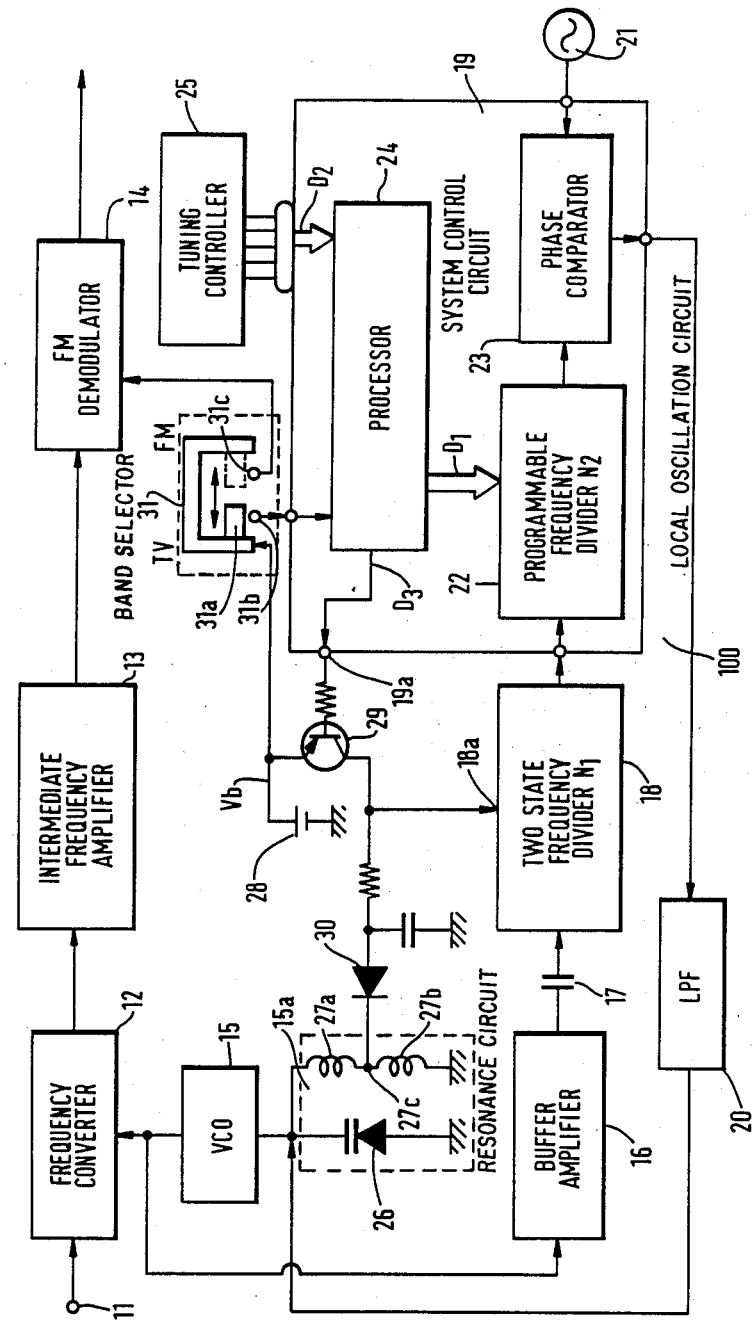

MULTI-BAND FM RECEIVER FOR RECEIVING FM BROADCASTING SIGNALS AND TV BROADCASTING SOUND SIGNALS

FIELD OF THE INVENTION

The present invention relates generally to a multi-band FM receiver, and more particularly to a multi-band FM receiver for receiving FM broadcasting signals and TV broadcasting sound signals.

BACKGROUND OF THE INVENTION

Recently, FM receivers which are adapted for receiving not only usual FM broadcasting signals, but also TV broadcasting sound signals have been developed. Such an FM receiver usually is provided with an FM receiving band and a TV sound receiving band. The bands are selected by a band selector.

In a conventional multi-band FM receiver, however, the FM receiving band is assigned to receive the FM broadcasting signals and TV broadcasting sound signals of the lower frequency channels, i.e., the channels 1, 2 and 3. On the other hand, the TV sound receiving band is assigned to receive the TV broadcasting sound signals of the higher frequency channels, i.e., the channels 4, 5, ..., 12.

This is because the frequencies of the lower frequency TV channels are closer to the frequencies of the FM broadcasting signals than to the frequencies of the higher frequency TV channels. Under the circumstances, the multiband FM receiver can be designed easily by assigning the lower frequency TV channels to the FM receiving band, instead of the TV sound receiving band. Thus, the TV channels are separated into at least two receiving bands in the conventional multi-band FM receiver.

However, users of the conventional multi-band FM receiver must select the FM receiving band, when reception of the TV broadcasting sound signals of any the lower frequency channels is desired. Therefore, the conventional multi-band FM receiver has a drawback in that it confuses the users, due to the inconsistency between the use of the FM receiving band and the reception of the TV sound signals.

In addition, the FM broadcasting signals and the TV broadcasting sound signals are different in the degree of FM modulation. The degree of FM modulation of the TV broadcasting sound signals is less than that of the FM broadcasting signals. As a result, different sound levels are output from the FM receiver for the FM broadcasting signals and the TV broadcasting sound signals. Thus, a user must operate the volume control for adjusting the output sound level, when changing between the FM broadcasting signals and the TV broadcasting sound signals in the FM receiving band.

SUMMARY OF THE INVENTION

It is, therefore, an object of the present invention to provide a multi-band FM receiver in which an FM receiving band and a TV sound receiving band are assigned to exclusive reception of the FM broadcasting signals and the TV broadcasting sound signals, respectively.

Another object of the present invention is to provide a multi-band FM receiver in which the lower frequency channels and the higher frequency channels of the TV broadcasting signals are combined in a single TV sound receiving band.

In order to achieve the above object, a multi-band FM receiver according to one aspect of the present invention in which the receiver includes a band selector for selecting a desired frequency group from the two group, a tuning controller for selecting a desired broadcast frequency within the desired group from a predetermined tuning band, an oscillator for separating signals of the desired frequency from the received broadcast signals and converting the separated signals into audio signals and a frequency adjuster responsive to the and selector and the tuning controller for automatically adjusting the oscillation frequency of the oscillator when the TV group has been selected for substantially removing the frequency gap from the predetermined tuning band.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawing showing an embodiment of the multi-band FM receivers according to the present invention.

DESCRIPTION OF THE PREFERRED EMBODIMENTS

The present invention will be described in detail with reference to the accompanying drawing.

Referring now to the accompanying drawings, an embodiment of the multi-band FM receiver according to the present invention will be described in detail.

In the accompanying drawing, an input terminal 11 is provided for receiving RF signals of the FM broadcasting signals and the TV broadcasting sound signals. The RF signals are supplied to a frequency converter 12. The frequency converter 12 is also supplied with a local oscillation signal from a local oscillation circuit 100, which will be described in detail later.

Therefore, the RF signal is converted to an intermediate frequency signal in the frequency converter 12. The intermediate frequency signal output from the frequency converter 12 is supplied to an intermediate frequency amplifier 13. The intermediate frequency amplifier 13 amplifies the intermediate frequency signal to a predetermined level. The amplified intermediate frequency signal is supplied to an FM demodulator 14. The FM demodulator 14 demodulates the intermediate frequency signal so that a sound signal is obtained from the FM demodulator 14. The sound signal output from the FM demodulator 14 is given to an audio amplifier (not shown) for driving a loudspeaker.

The local oscillation circuit 100 has a phase locked loop (referred as PLL hereafter) configuration. That is, the local oscillation circuit 100 is provided with a voltage controlled oscillator (referred as VCO hereafter) 15, a resonance circuit 15a which is a part of the VCO 15, a buffer amplifier 16, a coupling capacitor 17, a two-state frequency divider 18, a system control section 19, a low pass filter (referred as LPF hereafter) 20 and a reference signal oscillator 21. The VCO 15 and the other components are connected in the form of the PLL. The local oscillation circuit 100 generates a local oscillation signal stabilized in the frequency by the reference signal oscillator 21. However, the frequency of the local oscillation signal is varied by the system control section 19. The frequency dividing ratio N1 of the two-state frequency divider 18 is changeable between two ratios, e.g., 1 and ½.

Now, the system control section 19 will be described in detail. The system control section 19 is provided with a programmable frequency divider 22, a phase comparator 23 and a processor 24. The processor 24 may usually be comprised of a microcomputer. The programmable frequency divider 22 divides an output from the two-state frequency divider 18. The frequency dividing ratio N2 of the programmable frequency divider 22 is controlled by the processor 24. The phase of the output of the programmable frequency divider 22 is compared with the phase of the reference frequency signal from the reference signal oscillator 24. The phase error signal obtained by the phase comparator 23 is fed back to the VCO 15 through the LPF 20. Thus, the frequency of the local oscillation signal generated by the VCO 15 is controlled in accordance with frequency dividing ratio control data D1 applied from the processor 24 to the programmable frequency divider 22.

The frequency dividing ratio control data D1 is varied by tuning data supplied from a tuning controller 25 coupled to the system control section 19. Thus, a user can select a desired broadcasting signal through the tuning controller 25.

The resonance circuit 15a of the VCO 15 includes a variable capacitor 26 and a series circuit of inductor coils 27a and 27b. The variable capacitor 26 is coupled in parallel with the series circuit of the inductor coils 27a and 27b. A bias voltage source 28 applies a prescribed bias voltage Vb to a connection node 27c between the inductor coils 27a and 27b through a transistor 29 and a diode 30. The base of the transistor 29 is coupled to the processor 24 of the system control circuit 19 for receiving band control data D3. The collector of the transistor 29 is coupled to the resonance circuit 15a. Further, the collector of the transistor 29 is coupled to the two-state frequency divider 18.

Further, the multi-band FM receiver is provided with a band selector 31. The band selector 31 has a slider 31a movable between an FM position (shown by a broken line) and a TV position (shown by a solid line). In the TV position, the slider 31a supplies the predetermined bias Vb of the bias voltage source 28 to the processor 24 through a first selector terminal 31b. In the FM position, the slider 31a supplies the predetermined bias Vb to the FM demodulator 14 through a second selector terminal 31c.

The processor 24 generates the receiving band control data D3 in response to the bias voltage Vb supplied from the band selector 31. That is, the processor 24 generates the receiving band control data D3 when the TV position is selected in the band selector 31. The receiving band control data D3 automatically changes between two states, e.g., between a low level "L" or "0" and a high level "H" or "1", in response to selection of the lower channels 1, 2 and 3 or the high channels 4, 5, ..., 12 of the TV broadcasting signals.

Now, the operation of the multi-band FM receiver will be described in detail.

When setting to the FM receiving band is assumed, the output of the first selector terminal 31b of the band selector 31 becomes the low level "0". The output of the level "0" is input to the processor 24 and the processor 24 responds to this so that a fixed output "1" is obtained at a band control data output terminal 19a. That is, the output level of the control data output terminal 19a is fixed to the level "1" in the selection of the FM position. In response to the level "1", the transistor 29 is turned off and the diode 30 is cut off. Therefore, the series circuit of inductor coils 27a and 27b connected in parallel to the variable capacitor 26 is activated, and the resonance frequency of the resonance circuit 15a is determined by the variable capacitor 26 and the coils 27a and 27b. The collector output of the transistor 29, at this time, further is supplied to the control terminal 18a of the two-state frequency divider 18. Thus, the frequency dividing ratio N1 of the two-state frequency divider 18 is set, e.g. to 1.

When the band selector 31 is changed over to the TV position, the output of the band selector 31 through the first selector terminal 31b becomes the high level "1". At this moment, the output level on the band control data output terminal 19a of the system control section 19 becomes variable between a high level "1" and a low level "0".

When the tuning controller 25 selects any one of the lower channels 1, 2 and 3, the receiving band control data D3 on the band control data output terminal 19a becomes the high level "1". When the tuning controller 25 selects any one of the higher channels 4, 5, . . . , and 12, the receiving band control data D3 on the band control data output terminal 19a becomes "0". The receiving band control data D3 is automatically changed between the levels "1" and "0" by the processor 24. By the output level "1" on the band control data output terminal 19a of the system control section 19, the transistor 29 is turned on and the diode 30 also is turned on. As a result, the connection node 27c between the inductor coils 27a and 27b is grounded in respect to the oscillation signal. Thus, the inductor coil 27b is grounded.

Therefore, the resonance frequency of the resonance circuit 15a is determined by the variable capacitor 26 and the inductor coil 27a. At the same time, the control terminal of the two-state frequency divider 18 is supplied with the bias "1", so that the frequency dividing ratio N1 of the two-state frequency divider 18 is set, e.g. to ½.

According to the automatic changes of the resonance frequency of the resonance circuit 15a or the frequency dividing ratio N1 of the two-state frequency divider 18, the frequency band gap between the group of the lower channels 1, 2, 3 and the other group of the higher channels 4, 5, ... 12 is substantially eliminated. The tuning operation by the tuning controller 25, then, become easy.

Furthermore, the bias voltage Vb of the bias voltage source 28 is applied to the FM demodulator 14 through the second selector terminal 31c of the band selector 31. By this bias voltage Vb, the audio volume level output from the FM demodulator 14 is modified so that the level difference between audio outputs of the FM reception and the TV sound reception is eliminated.

Usually, as the lower channels 1, 2 and 3 of the TV broadcasting signal are received in the FM frequency band, a difference of sound volume is produced due to the difference of the degree of modulation degree between the FM broadcast wave and television sound signal. However, in the system of the invention such problem is not produced.

In the conventional system explained above, the lower channels 1, 2 and 3 are received in the usual receiving condition of the FM receiving band, so that a band selector does not correspond to the actually received band, i.e., the FM band and the TV band.

In this invention, however, the lower channels 1, 2 and 3 and the higher channels 4, 5, . . . , and 12 are included within a single receiving band, without widening the tuning range in the TV band. As a result, the operation of the band selector accurately corresponds to the actually received channel. That is, the circuit of inductor coils 27a and 27b at the local oscillation circuit 100 and the two-state frequency divider 18 are suitable in receiving the all channels 1 through 12 of the TV broadcasting signals in a single TV receiving band.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A multi-band receiver for receiving a plurality of broadcast signals having first and second groups of frequencies, the second group including at least two subgroups of frequencies separated by a fixed frequency gap, comprising:
    switch means for selecting one of said first and second groups;
    tuning control means coupled to the switch means for selecting a desired frequency within the selected one of the first and second groups from a predetermined tuning band;
    oscillation means having an oscillation frequency and responsive to said tuning control means for separating signals of the desired frequency from the received broadcast signals and for demodulating the separated signals into audio frequency signals; and
    adjusting means responsive to the switch means and the tuning control means for automatically adjusting the oscillation frequency of the oscillation means when the second group has been selected to substantially remove the fixed frequency gap from the predetermined tuning band.

2. The receiver of claim 1 wherein the adjusting means includes means for varying the oscillation frequency of the oscillation means.

3. The receiver of claim 1 wherein the adjusting means includes a frequency divider having a dividing ratio, and means for changing the dividing ratio to set the oscillation frequency of the oscillation means.

4. The receiver of claim 1 wherein the adjusting means includes a programmable frequency divider and a phase comparator connected to the programmable frequency divider for setting the oscillation frequency of the oscillation means.

5. The receiver of claim 1 wherein the oscillation means includes a frequency converter, an amplifier coupled to the frequency converter, and a demodulator coupled to the amplifier, and the switch means includes means for controlling the volume of the audio signals.

6. A method for receiving a plurality of broadcast frequencies having first and second groups of frequencies, said second group including at least two subgroups of frequencies separated by a fixed frequency gap, comprising the steps of:
    manually selecting one of the first and second groups of frequencies;
    manually selecting a desired broadcast frequency within the selected one of the first and second groups from a predetermined tuning band;
    generating an oscillation signal having an oscillation frequency to separate signals corresponding to the desired broadcast frequency from the received broadcast signals and demodulating the separated signals into audio signals; and
    automatically adjusting the oscillation frequency of the oscillating signal in accordance with the selected one of the first and second groups of frequencies and the desired broadcast frequency to substantially remove the fixed frequency gap from the predetermined tuning band at times when the switch means selects said second group.

* * * * *